(12) United States Patent
Alshinnawi et al.

(10) Patent No.: US 8,792,569 B2
(45) Date of Patent: Jul. 29, 2014

(54) POWER DISTRIBUTION SYSTEM UTILIZING DIGITAL COMMUNICATIONS TO DETERMINE THE CONFIGURATION THEREOF

(71) Applicant: International Business Machines Corporation, Armonk, NY (US)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/723,252

(22) Filed: Dec. 21, 2012

(65) Prior Publication Data

US 2014/0177736 A1   Jun. 26, 2014

(51) Int. Cl.
    *H04B 3/00*   (2006.01)
(52) U.S. Cl.
    USPC .......................................... 375/257; 375/258
(58) Field of Classification Search
    USPC .................................................. 375/257, 258
    See application file for complete search history.

(56) References Cited

U.S. PATENT DOCUMENTS

| | | | |
|---|---|---|---|
| 5,121,500 | A | 6/1992 | Arlington et al. |
| 6,816,757 | B1 | 11/2004 | DeLa Ree et al. |
| 7,542,268 | B2 | 6/2009 | Johnson, Jr. |
| 7,844,370 | B2 | 11/2010 | Pollack et al. |
| 8,198,998 | B1 | 6/2012 | Propp et al. |
| 2009/0287943 | A1 | 11/2009 | Brey et al. |
| 2010/0225167 | A1* | 9/2010 | Stair et al. ................. 307/29 |
| 2011/0025556 | A1 | 2/2011 | Bridges et al. |
| 2011/0101777 | A1 | 5/2011 | Jansma |
| 2011/0130884 | A1 | 6/2011 | Bhogal et al. |
| 2012/0042312 | A1* | 2/2012 | Isci et al. ..................... 718/1 |
| 2012/0074779 | A1 | 3/2012 | Black et al. |

FOREIGN PATENT DOCUMENTS

DE          10059564 A1    9/2002

OTHER PUBLICATIONS

Bienek, et al. "Identification and location of electrical devices, such as washing machines, cigarette dispensers, etc. using power-line communication, Bluetooth networks, etc. so that information about connected devices can be obtained" DE10059564A1 English Translation, Filing date: Nov. 30, 2000, 5 pages.
Anonymous, "Rack Identification Reporting and Illumination" IP.com No. IPCOM000206950D, May 13, 2011, 4 pages.

(Continued)

*Primary Examiner* — Kabir A Timory
(74) *Attorney, Agent, or Firm* — Katherine S. Brown; Jeffrey L. Streets

(57) ABSTRACT

Three-phase electrical power is used to distribute electrical power to electronic devices in a cluster. A power distribution system includes circuit breaker panels and power distribution units for providing electrical power to the electronic devices. The electrical connections within the power distribution system form a digital communication network that communicates identification codes for the purpose of identifying each electrical connection in the power distribution system. A cluster management entity may then collect the identification codes associated with each electrical connection in order to detect the actual configuration of the power distribution system. By further knowing the load of each electronic device and their association with entities of the power distribution system, the cluster management entity may determine the load on each phase and take steps to balance the load.

5 Claims, 9 Drawing Sheets

(56) References Cited

OTHER PUBLICATIONS

Onunga et al. "Distribution Line Communications Using CSMA Access Control with Priority Acknowledgements" IEEE Transactions on Power Delivery, vol. 4, No. 2, Apr. 1989, The University of British Columbia, Department of Electrical Engineering, Vancouver, B.C. Canada, p. 878-886.

* cited by examiner

| | Power consumer | | Rack Number | | Watts |
|---|---|---|---|---|---|
| 440 VAC #1 | 37500 | Line 1 (L1) | Breaker panel #1 | 1 | PDU #1 | 3000 |
| | | | | 1 | PDU #2 | 5000 |
| | | | | 1 | PDU #3 | 5000 |
| | | | | 1 | PDU #4 | 5000 |
| | | | Breaker panel #2 | 1 | PDU #1 | 3500 |
| | | | Breaker panel #3 | 2 | PDU #1 | 3500 |
| | | | | 2 | PDU #2 | 3500 |
| | | | | 2 | PDU #3 | 4500 |
| | | | | 2 | PDU #4 | 4500 |
| | 31000 | Line2 (L2) | Breaker panel #1 | 3 | PDU #1 | 2000 |
| | | | | 3 | PDU #2 | 4000 |
| | | | | 3 | PDU #3 | 4000 |
| | | | | 3 | PDU #4 | 3500 |
| | | | Breaker panel #2 | 4 | PDU #1 | 10000 |
| | | | Breaker panel #3 | 4 | PDU #1 | 7500 |
| | | | Breaker panel #4 | | No connect | |
| | | | Breaker panel #5 | | No connect | |
| | 28500 | Line 3 (L3) | Breaker panel #1 | 5 | PDU #1 | 5000 |
| | | | | 5 | PDU #2 | 4000 |
| | | | | 5 | PDU #3 | 4000 |
| | | | | 5 | PDU #4 | 4500 |
| | | | Breaker panel #2 | 5 | PDU #1 | 3500 |
| | | | | 5 | PDU #2 | 3500 |
| | | | | 5 | PDU #3 | 4000 |

| | |
|---|---|
| Server 1-1 | 450 |
| Server 1-2 | 550 |
| Server 1-3 | 700 |
| Server 1-4 | 700 |
| Server 1-5 | 600 |

FIG. 10

POWER DISTRIBUTION SYSTEM UTILIZING DIGITAL COMMUNICATIONS TO DETERMINE THE CONFIGURATION THEREOF

BACKGROUND

1. Field of the Invention

The present invention relates to power distribution systems for a computing cluster and methods of managing the distribution of electrical power to the devices in a computing cluster.

2. Background of the Related Art

A large computing cluster may consume a large amount of electrical power. The various components responsible for supplying the power to each entity in the computing cluster are referred to collectively as a power distribution system. The power distribution system may be specifically designed for the demands of a particular computing cluster. However, even the best design specification cannot anticipate the actual load conditions for the computing cluster once it has been put into service and the demands have shifted away from the original design criteria. Furthermore, the three phases of input voltage for the primary power distribution system may be imbalanced by such shifts in the load as well as by any mistakes in the electrical connections within the power distribution system.

BRIEF SUMMARY

Yet another embodiment provides a system comprising a plurality of servers in communication with a cluster management entity, and a power distribution system for providing electrical power to the plurality of servers. The power distribution system includes a three phase electrical source, each phase having at least one electrical power supply cable forming an electrical connection from the phase to at least one circuit breaker panel for providing electrical power to the at least one circuit breaker panel, each circuit breaker panel having at least one electrical power supply cable forming an electrical connection from the circuit breaker panel to at least one power distribution unit for providing electrical power to the at least one power distribution unit, and each of the power distribution units having at least one electrical power supply cable forming an electrical connection from the power distribution unit to at least one of the servers for providing electrical power to the at least one of the servers. Each circuit breaker panel has a circuit breaker panel management processor, and each power distribution unit having a power distribution unit management processor. For each power distribution unit, the power distribution unit management processor of the power distribution unit is in digital communication with the circuit breaker panel management processor of the circuit breaker that provides electrical power to the power distribution unit. The digital communication is carried over the electrical cable forming the electrical connection between the power distribution unit and the circuit breaker panel. Still further, the circuit breaker panel management processor and the power distribution unit management processor are coupled for communication with the cluster management entity.

BRIEF DESCRIPTION OF THE SEVERAL VIEWS OF THE DRAWINGS

FIG. 10 is a table illustrating one example of the information that may be collected by the cluster management entity about the load on the components of the power distribution system.

DETAILED DESCRIPTION

Figure 1:
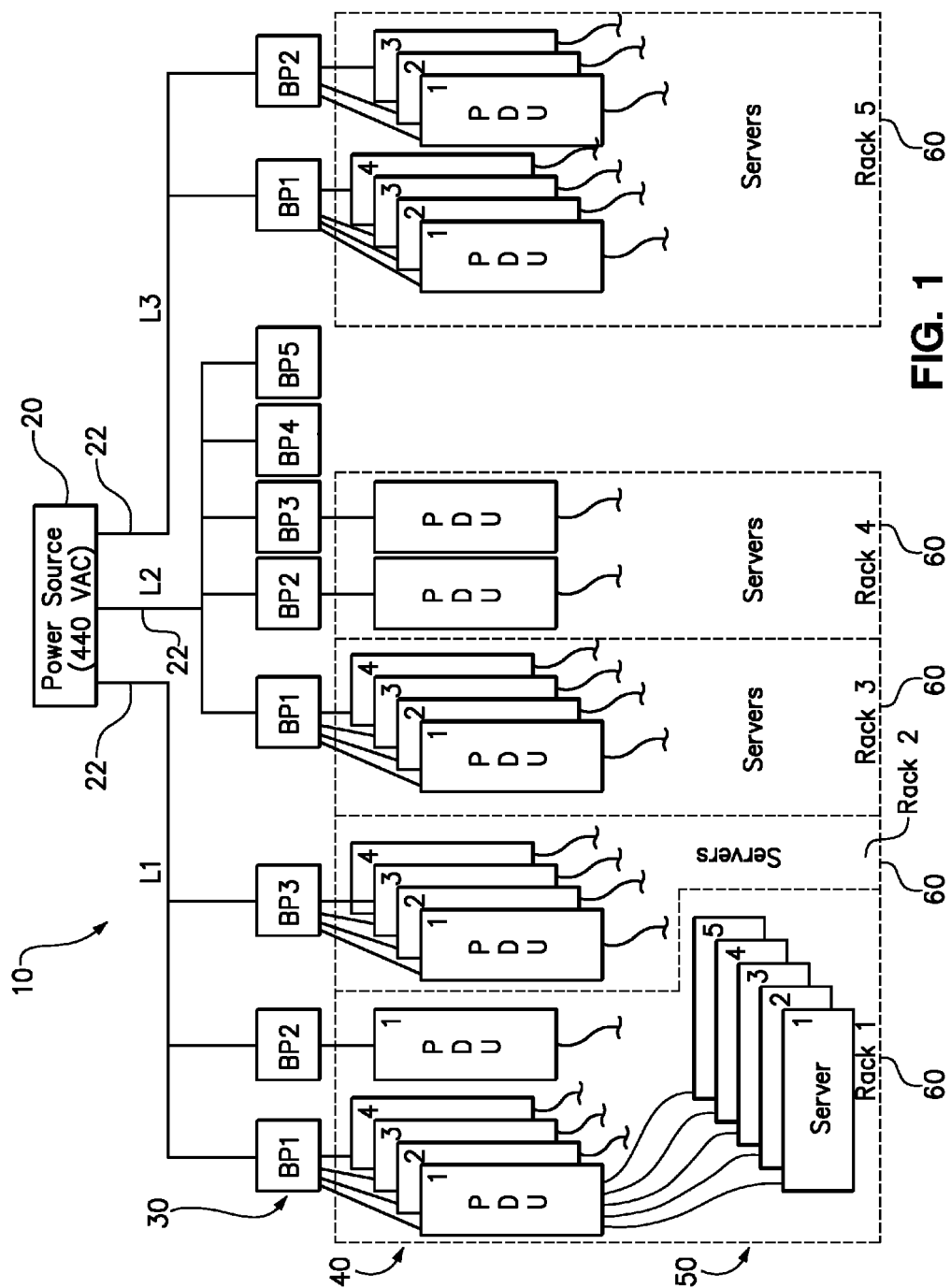
FIG. 1 is a diagram of a power distribution system for a cluster.

One embodiment of the present invention provides a method comprising providing digital communication over an electrical power supply cable between a management processor in a circuit breaker panel and a management processor in a power distribution unit, wherein the circuit breaker panel has a circuit breaker identification code and the power distribution unit has a power distribution unit identification code. The digital communication provides the circuit breaker panel management processor with the power distribution unit identification code for the power distribution unit that is connected through the electrical power supply cable to the circuit breaker panel, or the digital communication provides the power distribution unit management processor with the circuit breaker panel identification code for the circuit breaker panel that is connected through the electrical power supply cable to the power distribution unit. The method further comprises identifying the electrical power supply cable connection by communicating first and second endpoints of the electrical power supply cable connection to a cluster management entity, wherein the first endpoint is identified by the circuit breaker panel identification code and the second endpoint is identified by the power distribution unit identification code. With this information, the cluster management entity is able to determine the power distribution layout and the power consumed by each part of the power distribution network.

The electrical power supply cables may be of various types. For example, a server power supply cable may have a three socket connector at the server end and a three prong connector at the other end for plugging into a power distribution unit. Other power supply cables may have one or more end that is stripped of insulation and secured to a terminal. These and other types of electrical power supply cables may be used in accordance with the present invention to supply electrical power from one point to another, such as from a three-phase power source to a circuit breaker panel, from a circuit breaker panel to a power distribution unit, and from a power distribution unit to a server, network switch, data storage device or other electronic device that may be used in a cluster environment.

The electrical power supply cable also provides a pathway for digital communication between a management processor in a circuit breaker panel and a management processor in a power distribution unit. This type of digital communication may use the same technology that is used in Ethernet Over Power. However, a more preferred digital communication follows a carrier sense multiple access protocol with collision detection. A management processor will communicate over the electrical power supply cable using a digital transceiver coupled for communication over the electrical power cable. For example, digital communication between a circuit breaker panel management processor and a power distribution unit management processor may include the circuit breaker panel management processor using a transceiver in communication with each electrical power supply cable providing power to a power distribution unit, and each power distribution unit management processor using a transceiver in communication with the electrical power supply cable providing power to the power distribution unit.

Embodiments of the present invention recognize that an electrical power supply cable connection is used as the transmission medium which can be described by its endpoints. Each endpoint is provided with a management processor and each endpoint is assigned an identification code. Digital communication between the management processors at the two endpoints of an electrical power supply cable connection enables those two management processors to form an association between their identification codes. These digital communications can occur between the two management processors at the endpoints of every electrical power supply cable connection in the power distribution system. When some or all of the management processor report the pair of identification codes associated with each electrical power supply cable connection to a common entity, such as a cluster management entity, that entity has a full description of the power distribution system. It is important to recognize that this provides a full description of the power distribution system as actually installed, whether or not the power cables were connected according to a design specification.

In a specific embodiment, the digital communication may provide a circuit breaker panel management processor with a power distribution unit identification code for the power distribution unit that is connected through the electrical power supply cable to the circuit breaker panel, or the digital communication may provide a power distribution unit management processor with a circuit breaker panel identification code for the circuit breaker panel that is connected through the electrical power supply cable to the power distribution unit. The method further comprises identifying the electrical power supply cable connection by communicating first and second endpoints of the electrical power supply cable connection to a cluster management entity, wherein the first endpoint is identified by the circuit breaker panel identification code and the second endpoint is identified by the power distribution unit identification code.

In a further embodiment, the method further includes the power distribution unit detecting its position in the computer system rack and including the detected rack position as part of the power distribution unit identification code. Optionally, the rack position of other devices is identified by each of those other devices detecting a rack position and communicating the detected rack position to a central management entity. In one embodiment, a computer system rack includes a plurality of power distribution units and a plurality of servers that each detect their position in the rack. The relative rack positions may then be used to determine which server is coupled to receive electrical power from which power distribution unit.

It should also be recognized that electrical power is typically supplied from a power distribution unit to a plurality of electronic devices selected from servers, network switches and data storage devices. After determining which electronic devices are coupled to a particular power distribution unit, the management processor identifies a load associated with the plurality of electronic devices and communicates that load to the cluster management entity.

In a further embodiment, the method further provides digital communication over an electrical power line, which supplies electrical power from a three phase power source to a circuit breaker panel, between the management processor in the circuit breaker panel and a management processor coupled to the electrical power line. An electrical power line identification code is associated with the electrical power line and may be stored in a medium accessible to the management processor that is coupled to the electrical power line. The digital communication may either provide the circuit breaker panel management processor with the electrical power line identification code for the electrical power line, or provide the electrical power line management processor with the circuit breaker panel identification code for the circuit breaker panel. The method may then identify the electrical power line connection by communicating the first and second endpoints of the electrical power line connection to a cluster management entity, wherein the first endpoint is identified by the electrical power line identification code and the second endpoint is identified by the circuit breaker panel identification code.

As with the electrical power supply cable between a circuit breaker panel and a power distribution unit, the electrical power line provides a pathway for digital communication between a circuit breaker panel management processor and the electrical power line management processor. This type of digital communication may use the same technology that is used in Ethernet Over Power. However, a more preferred digital communication follows a carrier sense multiple access protocol with collision detection (CSMA/CD). Management processors communicate over the electrical power line using a digital transceiver coupled for communication over the electrical power line.

In a still further embodiment, a load associated with each of the plurality of electronic devices is identified, the electrical connection between each electronic device and a power distribution unit is determined, the electrical connection between each power distribution unit and a circuit breaker panel is determined, and the electrical connection between each circuit breaker panel and one of the three phases of the power source is determined. By communicating this information to a cluster management entity, the cluster management entity can calculate the load on a power distribution unit, calculate the load on a circuit breaker panel, and/or calculate the load on each phase.

Another embodiment of the invention provides a method that comprises using three-phase electrical power to supply electrical power to a plurality of electronic devices in a cluster, wherein each phase has an electrical connection with at least one circuit breaker panel for providing electrical power to the at least one circuit breaker panel, wherein each circuit breaker panel has an electrical connection with at least one power distribution unit for providing electrical power to the at least one power distribution unit, and wherein each power distribution unit has an electrical connection with at least one of the electronic devices for providing electrical power to the at least one of the electronic devices. The method further comprises establishing a digital communication network that communicates over the electrical connections, and assigning identification codes to each phase, each circuit breaker panel, and each power distribution unit. The method then communicates over each of the electrical connections to associate, for each power distribution unit, the identification code assigned to the power distribution unit with the identification code assigned to the circuit breaker panel to which the power distribution unit has an electrical connection, and to associate, for each circuit breaker panel, the identification code assigned to the circuit breaker panel with the identification code assigned to the phase to which the circuit breaker has an electrical connection. For each electrical connection, the method collects the identification codes associated with the electrical connection.

The method may further include identifying an amount of load associated with a plurality of electronic devices coupled to the power distribution unit, and communicating the amount of load to the cluster management entity. As discussed above, the cluster management entity can use the information about individual loads and the electrical connections to calculate various system loads. For example, the method may calculate, for each of the circuit breaker panels, an amount of load on the circuit breaker panel as the sum of the amount of load on each power distribution unit having an identification code that is associated with the identification code of the circuit breaker panel. In a further example, the method may calculate, for each of the phases, an amount of load on the phase as the sum of the amount of load on each circuit breaker panel having an identification code that is associated with the identification code of the phase. Accordingly, the method may identify any imbalance in the amount of load on each of the three phases.

In yet another embodiment, the method may take one or more action to address an imbalance in the amount of load on the three phases. For example, one or more workloads may be moved from at least one of the electronic devices that are receiving electrical power from a first phase to at least one of the electronic devices that is receiving electrical power from a second phase, wherein the first phase has a greater load than the second phase. In another example, one or more additional workloads may be assigned to at least one of the electronic devices that are receiving electrical power from a first phase, wherein a second one of the three phases has a greater load than the first phase. Still further, the method may identify that a first phase has a greater load than the second phase, then instruct a user to disconnect one or more of the electronic devices that is receiving electrical power from the first phase, and reconnecting the one or more of the electronic devices to the second phase.

Yet another embodiment provides a system comprising a plurality of servers in communication with a cluster management entity, and a power distribution system for providing electrical power to the plurality of servers. The power distribution system includes a three phase electrical source, each phase having at least one electrical power supply cable forming an electrical connection from the phase to at least one circuit breaker panel for providing electrical power to the at least one circuit breaker panel, each circuit breaker panel having at least one electrical power supply cable forming an electrical connection from the circuit breaker panel to at least one power distribution unit for providing electrical power to the at least one power distribution unit, and each of the power distribution units having at least one electrical power supply cable forming an electrical connection from the power distribution unit to at least one of the servers for providing electrical power to the at least one of the servers. Each circuit breaker panel has a circuit breaker panel management processor, and each power distribution unit having a power distribution unit management processor. For each power distribution unit, the power distribution unit management processor of the power distribution unit is in digital communication with the circuit breaker panel management processor of the circuit breaker that provides electrical power to the power distribution unit. The digital communication is carried over the electrical cable forming the electrical connection between the power distribution unit and the circuit breaker panel. Still further, the circuit breaker panel management processor and the power distribution unit management processor are coupled for communication with the cluster management entity.

In one embodiment of the system, the circuit breaker panel management processor stores a circuit breaker panel identification code and the power distribution unit management processor stores a power distribution unit identification code.

In another embodiment of the system, an electrical phase management processor is coupled to each of the three phases, and a carrier detection circuit allows a valid communication with the electrical phase management processor to occur on only one of the three phases at a time, wherein the carrier detection circuit identifies the phase from which the valid communication occurs. Since the power distribution system is connected in a bus structure where each entity is physically connected to every other entity within the power distribution system, the carrier detection circuit is able to identity each physical link separately by using a timing method. This timing method is described in reference to FIGS. 5, 6, 7 and 8.

In still further embodiment of the system, for each circuit breaker panel, the circuit breaker panel management processor of the circuit breaker panel is in digital communication with the electrical phase management processor over the electrical cable forming the electrical connection between the circuit breaker panel and one of the phases. The electrical phase management processor is preferably coupled for communication with the cluster management entity.

It should be recognized that the communications between two management processors, as well as the communications between any one of the management processors and the cluster management entity, may be implemented in a computer program product that provides a processor with computer usable program code for implementing one or more steps of the methods described herein. Many other aspects of the methods of the present invention may also be implemented with computer usable program code.

FIG. 1 is a diagram of a power distribution system 10 for a cluster that includes a plurality of servers 50. The main electrical power source 20 comes into a building as a three-phase voltage at 440 VAC. These three phases are then broken down into two-phase 220 VAC or three single-phase 120 VAC lines 22. The three power lines 22 as labeled as L1, L2 and L3.

Each electrical power line 22 is connected to one or more circuit breaker panels, which are labeled as BP# (Breaker Panel number). While FIG. 1 numbers the circuit breaker panels 30 for each power line 22 starting from "1", each circuit breaker panel 30 may be unique and will preferably have its own circuit breaker panel identification code to distinguish it from the other circuit breaker panels. It should also be recognized that the power distribution system 10 might also have "layered" circuit breaker panels, where a first circuit breaker panel has an electrical supply output that is connected to the input to a second circuit breaker panel. However, management processors in the first and second circuit breaker panels may still communicate their identification codes to identify the electrical connection between the two circuit breaker panels, and communicate the endpoints of the electrical connection to the cluster management entity. This communication may occur in the same manner described herein for a communication between a circuit breaker panel management processor and a power distribution unit management processor.

Each circuit breaker panel 30 may be connected to a power distribution unit (PDU) 40 in order to provide electrical power to each power distribution unit 40. As with the circuit breaker panels, FIG. 1 numbers the power distribution units 40 connected to each circuit breaker panel 30 starting from "1". However, each power distribution unit 40 will preferably have its own power distribution unit identification code to distinguish it from the other power distribution units. It should also be recognized that the power distribution system 10 might also have "layered" power distribution units, where a first power distribution unit has an electrical supply output that is connected to the input to a second power distribution unit. However, management processors in the first and second power distribution units may still communicate their identification codes to identify the electrical connection between the two power distribution units, and communicate the endpoints of the electrical connection to the cluster management entity. This communication may occur in the same manner described herein for a communication between a circuit breaker panel management processor and a power distribution unit management processor.

The servers 50, as well as other electronic devices, are connected to the power distribution units 40 to receive electrical power. The servers 50 and other electronic devices may be arranged into racks 60 and place a load on the power distribution units 40. As shown, the power distribution units 40 are also disposed with the racks 60.

Figure 2:
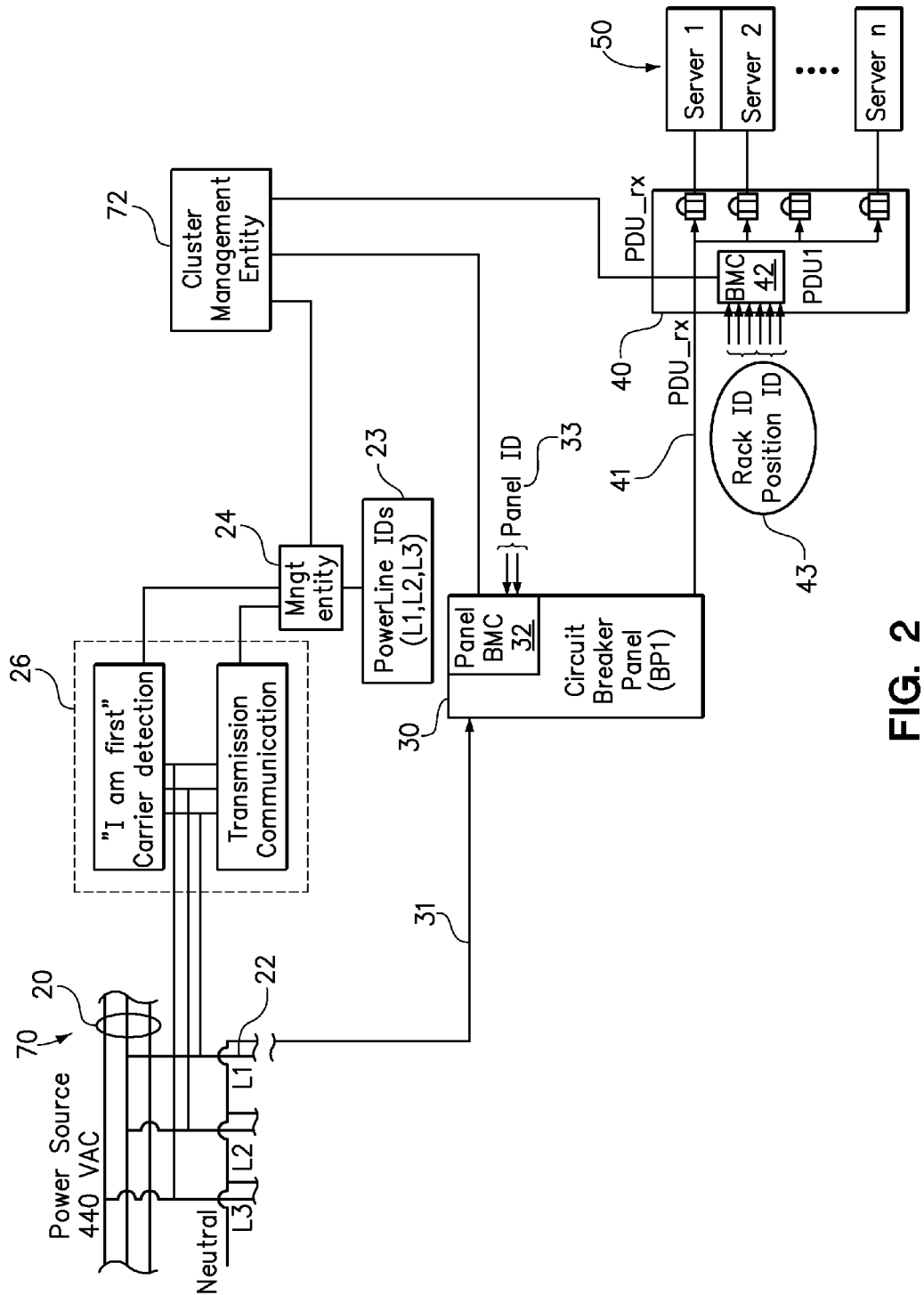
FIG. 2 is a diagram of a power circuit within the power distribution system.

FIG. 2 is a diagram of a power circuit 70 within the power distribution system 10 of FIG. 1. The power circuit 60 encompasses the supply of electrical power from the three-phase power source 20, through the L1 single-phase power line 22, through the circuit breaker panel 30, and through the power distribution unit 40 to one or more servers 50 (Servers 1 through n). Accordingly, this power circuit 70 is representative of any one branch of the power distribution system 10.

In accordance with one embodiment of the present invention, the three single-phase power lines 22 are associated with a management processor 24, the circuit breaker panel 30 includes a management processor (baseboard management controller, BMC) 32, and the power distribution unit 40 includes a management processor (baseboard management controller, BMC) 42. These management processors 24, 32, 42 are each in communication with a cluster management entity 72. The management processors and the management entity could be dedicated solely to the performance of the present invention, but may be capable of further functions. In particular, the cluster management entity is typically responsible for a wide variety of management functions over a cluster of servers.

The electrical power line management processor 24 is able to communicate with the circuit breaker panel management processor 32 via the electrical supply cable 31 forming an electrical connection there between. Similarly, the circuit breaker panel management processor 32 is able to communicate with the power distribution unit management processor 42 via the electrical power supply cable 41. In each instance, the management processor is able to transmit and/or receive signals by coupling the transmission signal to the AC line or cable. The management processor may communicate with a detection and transmission entity for this purpose. For example, the electrical power line management processor 24 is shown coupled to a detection and transmission entity 26. A similar detection and transmission entity may be included in the circuit breaker panel and the power distribution unit, but are not shown in FIG. 2. A more detailed description of the detection and transmission entity 26 is provided in reference to FIGS. 5-8.

Furthermore, the electrical power line management processor 24 is able to access electrical power line identification codes for each of the electrical power lines 22 (L1, L2, L3), the circuit breaker panel management processor 32 is able to access a circuit breaker panel identification code, and the power distribution unit management processor 42 is able to access a power distribution unit identification code. Each of the identification codes are preferably unique and may be arbitrary or systematic. In one example, the electrical power line identification codes 23 may be arbitrarily assigned and stored in media accessible to the electrical power line management processor 24, while the circuit breaker panel identification code 33 may be detected by the circuit breaker panel management processor 32 and the power distribution unit management processor 42 is able to detect a power distribution unit identification code 43. As described in relation to FIGS. 3 and 4, the circuit breaker panel identification code 33 may be dependent upon the position of the circuit breaker panel 30 in a circuit breaker box (not shown) and the power distribution unit identification code 43 may be dependent upon the position of the power distribution unit 40 in a rack.

Figure 3:
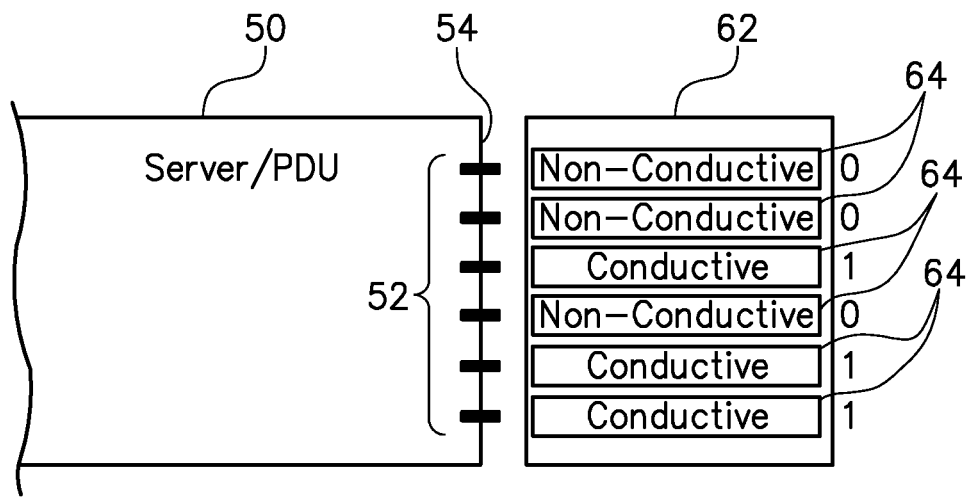
FIG. 3 is a diagram of a server aligned for contact with an address plate in a given position within a rack.

FIG. 3 is a diagram of a device 50, such as a server or PDU, aligned for contact with an address plate 62 in a given position within a rack. Each device 50 can determine its own position within the rack and communicate that position to a central management entity, such as an Extreme Cloud Administrative Toolkit (xCAT) management entity (available from International Business Machines Corporation of Armonk, N.Y.). Rack positions may be selected from a known number and arrangement of bays within the rack, such as following a standard configuration of "1U" bays. For example, a server 50 can detect its own position using a plurality of spring-loaded electrical pickups 52 formed along a back surface 54 of the server and aligned for contact with an equal plurality of contacts 64 on an address plate securing within the rack. As shown, there are six pickups 52 aligned with six contacts 64. The contacts 64 on each address plate 62 are either conductive or non-conductive and are arranged to provide a unique binary code representing a known location in the rack. Optionally, a non-conductive contact may represent a "0" and a conductive contact may represent a "1". When the contacts 64 are arranged for contact with the spring-loaded electrical pickups 52, the server 50 is able to read the address that represents its location within the rack. For example, the address shown is binary "0 0 1 0 1 1 b" (binary notation) which equates to position 11 within the rack. A PDU may similarly detect its own position. Based upon a consistent practice of connecting a server 50 to a power distribution unit 40 based upon their relative positions within a rack, such as making power connections directly laterally, the relative positions can be considered to be determinative of which servers are connected to which PDUs.

Figure 4:
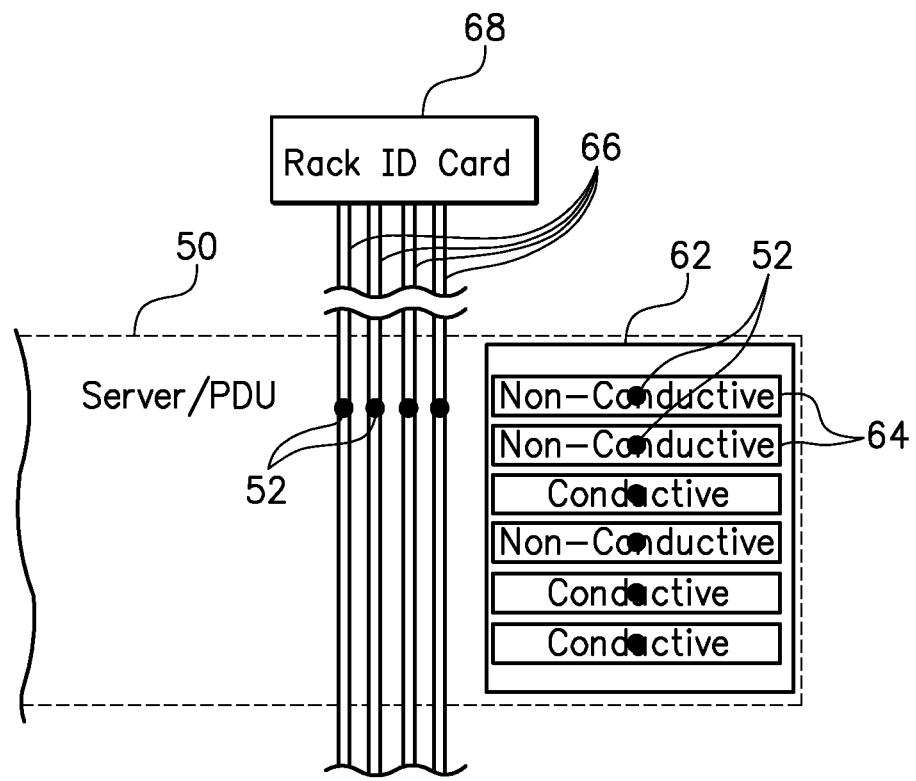
FIG. 4 is a diagram of a server aligned in contact with rack identification wires and the address plate.

FIG. 4 is a diagram of a device 50, such as a server or a PDU, aligned in contact with rack identification wires 66 and the address plate 62. Accordingly, each device may detect a rack identification code or address for the rack in which the device is positioned. For example, a rack identification card 68 may be added to the rack and may include a battery and electrical wires 66 that run down a vertical frame of the rack. The rack identification card 68 includes a unique rack address that is placed onto the wires 66 that run from the card connection down the rack frame. As described above for position detecting within a rack, the installed server or PDU may include electrical pickups 52 that are aligned for contact with the wires 66 along the vertical frame. For example, a plurality of wires may be selectively coupled to a battery or ground in order to comprise a binary rack identification number. One illustration of the location of a device 50 may be represented as Rack#-U#, which is a concatenation of the rack identification (Rack #) and the U position (U#) of the device.

Figure 5:
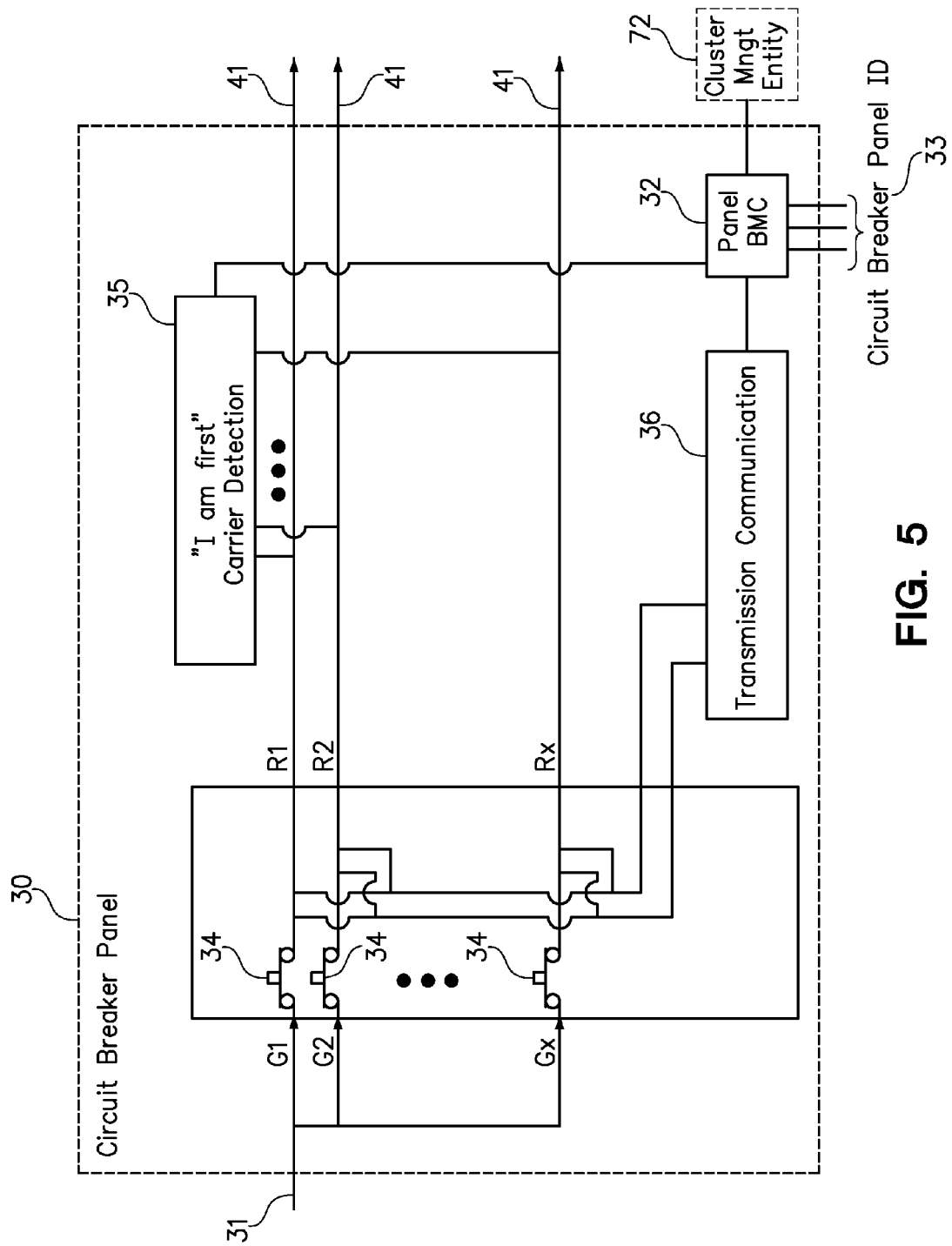
FIG. 5 is a diagram of a circuit breaker panel.

FIG. 5 is a diagram of a circuit breaker panel 30. A power supply line 31 from a higher level circuit, such as the 440 VAC line 1 (L1), branches into inputs G1 through Gx. R1 through Rx are the outputs 41 after the circuit breakers 34. Accordingly, G1 goes to R1, G2 goes to R2, and Gx goes to Rx. R1, R2 and R3 lead to downstream PDUs 40.

The circuit breaker panel 30 has a panel BMC 32 which detects its circuit breaker panel identification code 33 and can communicate with the cluster management entity 72. The panel BMC 32 is also associated with a carrier detection circuit 35 and a transmission communication device 36. The operation of the carrier detection circuit 35 is described in greater detail in relation to FIGS. 7 and 8. However, the carrier detection circuit 35 has a set of leads in contact with the output lines R1-Rx. When the carrier detection circuit 35 detects a carrier signal on one of these signal lines, the circuit 35 can inform the panel BMC 32 which electrical power supply cable had the first signal. The transmission communication device 36 will then receive the communication. Together, the carrier detection circuit 35 and the transmission communication device 36 enable the panel BMC 32 to receive communications from various sources, yet identify where the communication came from. The operation of the carrier detection circuit 35 also prevents corruption of a communication due to multiple simultaneous communications.

Figure 6:
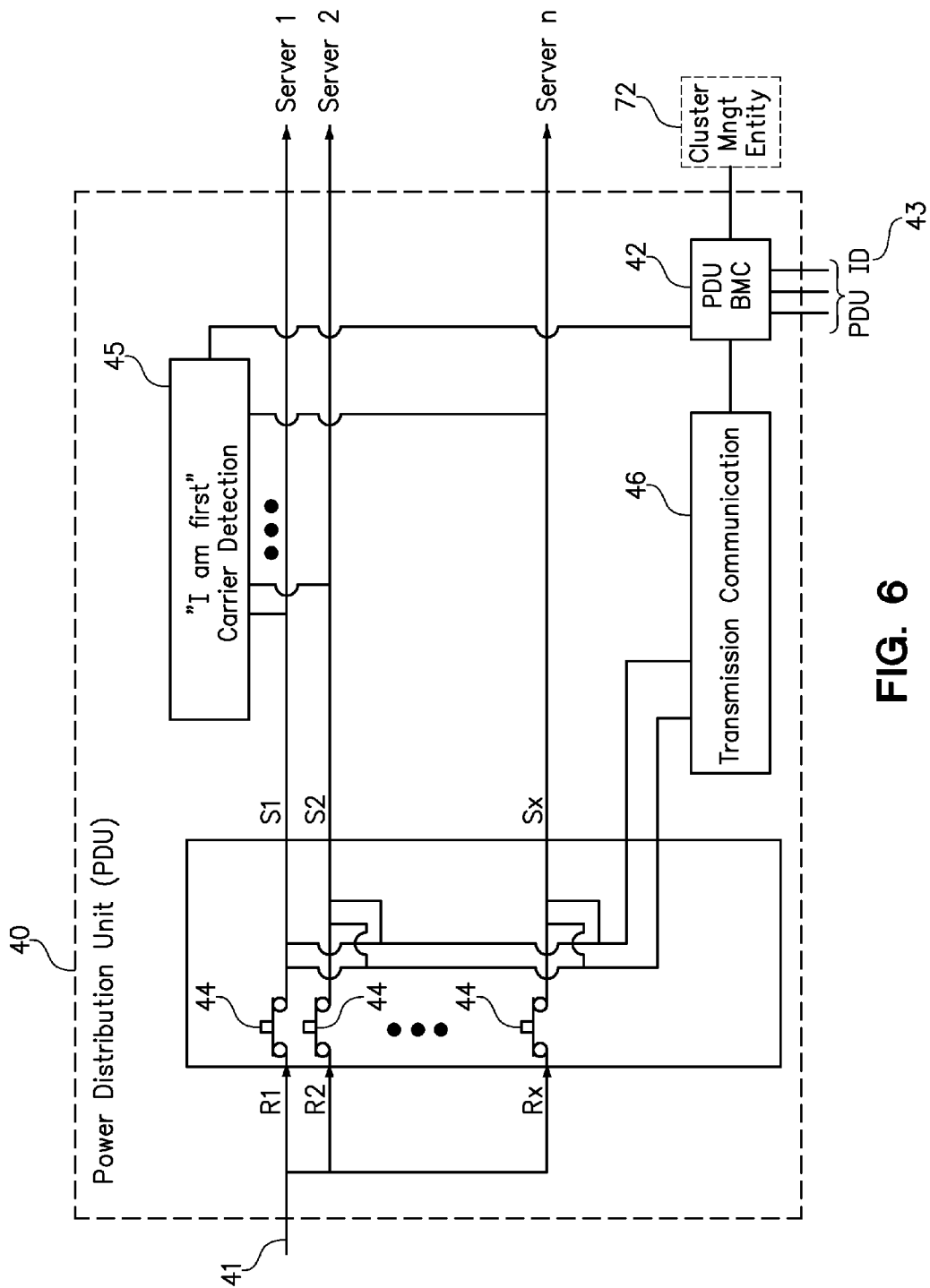
FIG. 6 is a diagram of a power distribution unit.

FIG. 6 is a diagram of a power distribution unit 40. R1 through Rx are inputs 41 from the higher level circuit, such as the output from the circuit breaker panel. S1 through Sx are the outputs from the power distribution unit 40 to the servers (Server 1 through Server n).

The power distribution unit 40 has a PDU BMC 42 which detects its power distribution unit identification code (PDU ID) 43 and can communicate with the cluster management entity 72. The PDU BMC 42 is also associated with a carrier detection circuit 45 and a transmission communication device 46. The operation of the carrier detection circuit 45 is described in greater detail in relation to FIGS. 7 and 8. However, the carrier detection circuit 45 has a first set of leads in contact the output lines S1-Sx. When the carrier detection circuit 45 detects a carrier signal on one of these signal lines, the circuit 45 can inform the PDU BMC 42 which electrical power supply cable had the first signal. The transmission communication device 46 will then receive the communication. Together, the carrier detection circuit 45 and the transmission communication device 46 enable the PDU BMC 42 to receive communications from various sources, yet identify where the communication came from. The operation of the carrier detection circuit 45 also prevents corruption of a communication. Once communication is established between one entity (i.e., a server 50 in FIG. 2) on the Rx output lines and the PDU BMC 42, the PDU BMC 42 is able to obtain the unique ID of the entity attached to that specific line. As entities are added to each Rx output line, the PDU BMC 42 is able to tabulate which entity 50 is associated with which Rx output line.

Figure 7:
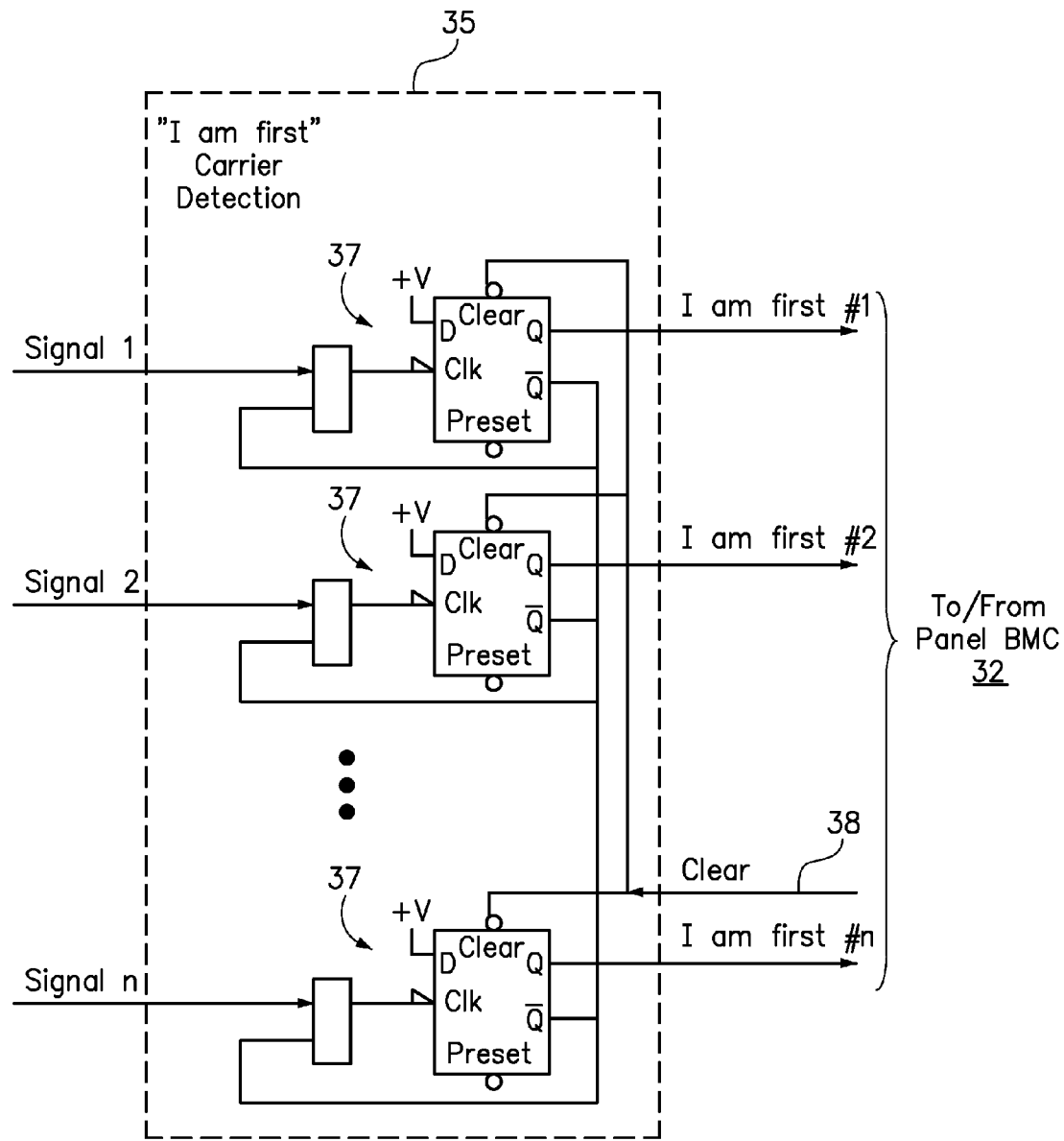
FIG. 7 is a diagram of a carrier detection circuit.

FIG. 7 is a diagram of the carrier detection circuit 35 having three leads for detecting a carrier signal on any of three electrical power supply cables 31. Signal n is an Ethernet-type transmission signal from either the electrical power line management processor 24 or the power distribution unit management processor 42. For example, Signal 1 in FIG. 7 may come from line (R1) 41 in FIG. 5. The carrier detection circuit 35 includes an edge-triggered latch 37 in each signal line. When a carrier signal is detected, the latch "Q" output goes to a logical "1" level, and the Q-not goes to a logical "0" and disables the remainder of the circuit. However, the latch must be reset in order for another entity to transmit a signal. So, the management processor 32 in the circuit breaker 30 will reset the latch with the "Clear from Detection Circuit" signal 38. Using an Ethernet-type protocol, each entity (such as a power distribution unit management processor or an electrical power line management processor) waits a different random amount of time and then transmits a signal in the same manner to identify itself. The carrier detection circuit 45 in the power distribution unit 40 works in the same manner.

Referring back to FIG. 5, the circuit breaker panel 30 used the carrier detection circuit 35 to identify the PDU that is connected to each output 41 from the circuit breaker panel. Note that the electrical power supply lines or cables are similar to the bus structure of an Ethernet network in which each originator is attached to the same physical bus. However, the circuit breaker of the present invention takes advantage of the delay between the time the first entity receives the signal and the time it is transmitted to the other bus connections within the circuit breaker box. First, the originator of the message transmits a message and monitors his own message to ensure it is not corrupted by someone else on the bus. For example, the PDU BMC 42 may transmit a communication using the carrier sense multiple access with collision detection (CSMA/CD) scheme similar to the Ethernet protocol. If the communication is corrupted, the PDU BMC (the "originator" in this example) waits a random amount of time and then retries the transmission of the communication. Assuming two or more entities do not transmit on the power circuit at the same time, the circuit breaker panel management processor 32 can then identify and communicate with each PDU BMC to identify which entity is on which power circuit and also obtain power status for that entity.

Figure 8:
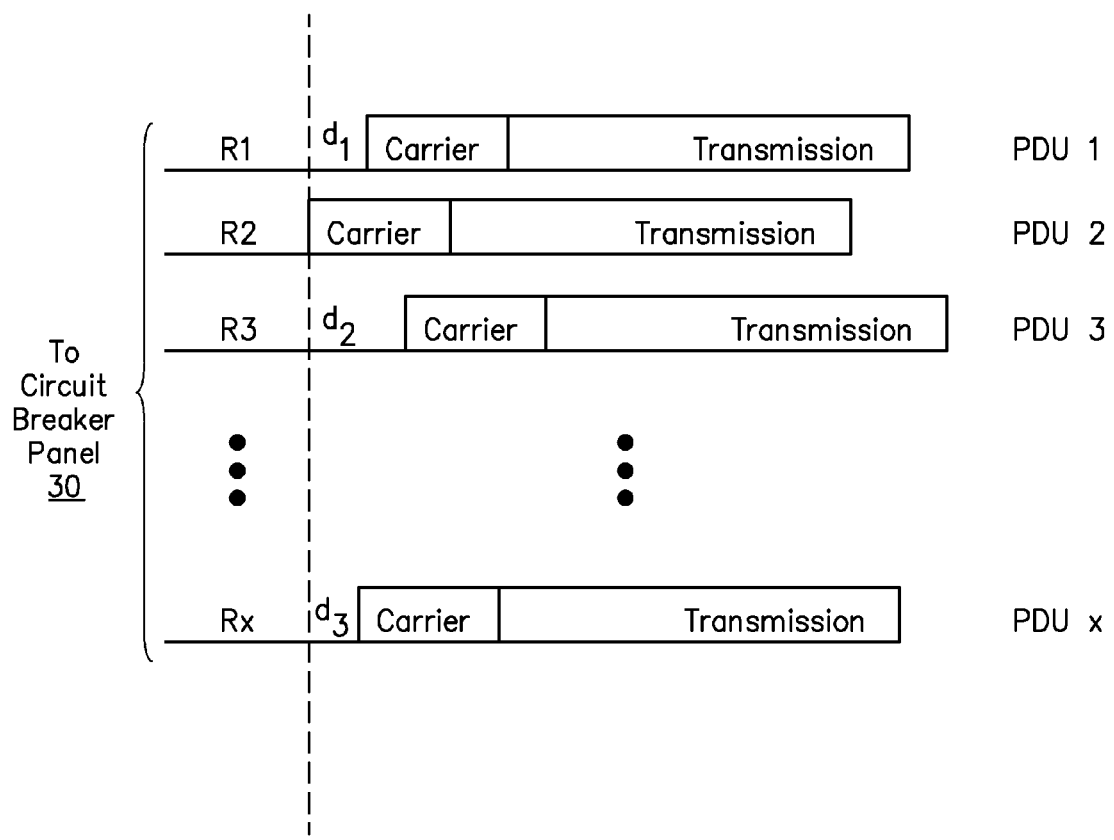
FIG. 8 is a timing diagram illustrating four attempted communications from a power distribution unit to a circuit breaker panel.

FIG. 8 is a timing diagram illustrating four attempted communications from four power distribution units 40 to a circuit breaker panel 30. In the timing diagram, PDU 2 is detected first because there is a delay of d1 in the carrier signal from PDU 1, a delay of d2 in the carrier signal from PDU 3, and a delay of d3 in the carrier signal from PDU X Once this occurs, the transmission between the circuit breaker panel management processor and the PDU 2 management processor occurs. Once the transmission is complete, the circuit breaker panel management processor resets the "I am first" circuitry (using the clear signal 38 in FIG. 7) and waits for the next PDU to identify itself. The PDU BMC preferably identifies itself with a Rack#/PDU# identification code, which is used to give the cluster management entity a clear picture of the electrical connections in the cluster. Note that the same diagram is used for each power identification level, including the PDU, circuit breaker, and 440 VAC input.

Figure 9:
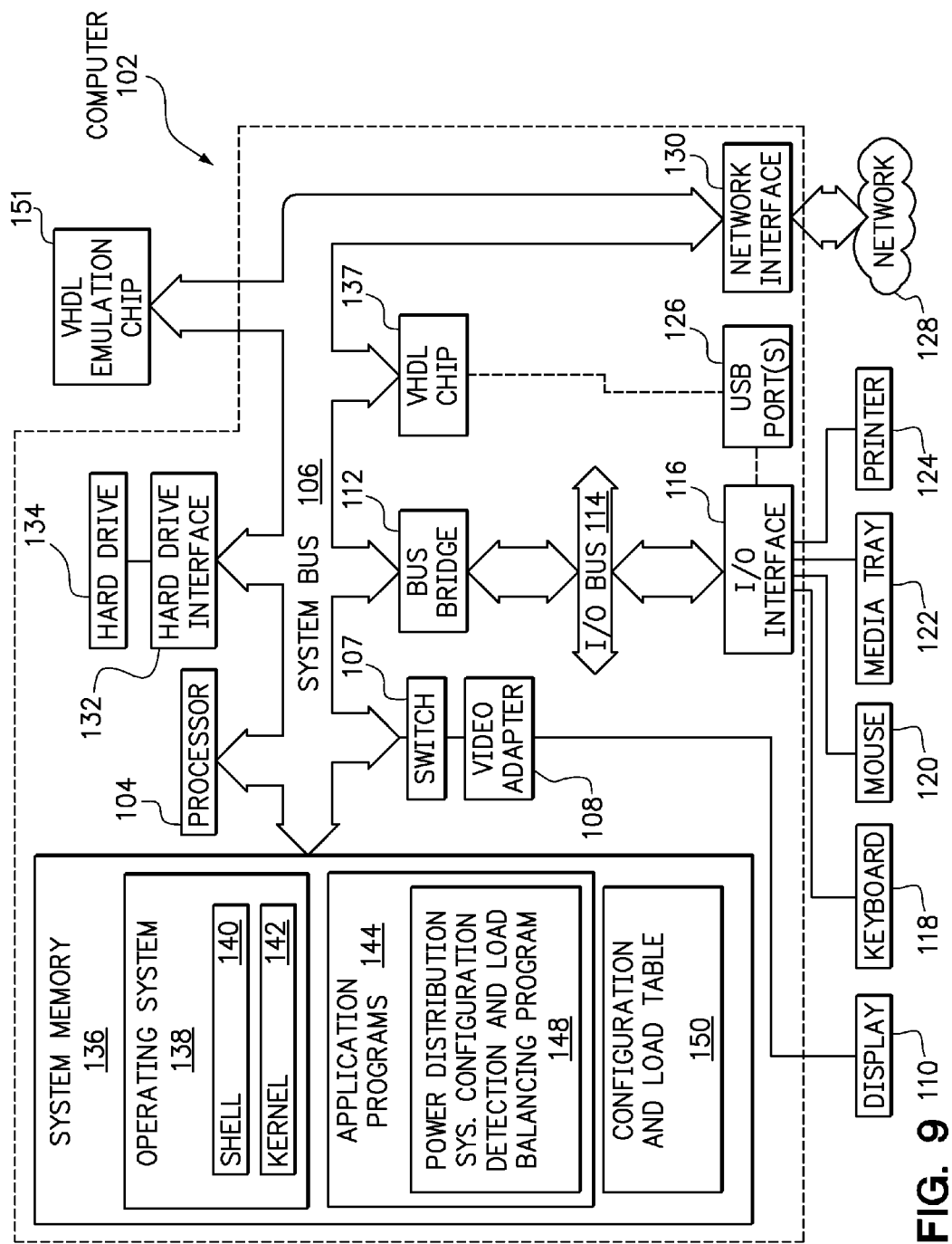
FIG. 9 is a diagram of a computer capable of serving as a cluster management entity.

FIG. 9 is a diagram of a computer capable of serving as a cluster management entity in accordance with one or more embodiments of the present invention. Note that some or all of the exemplary architecture, including both depicted hardware and software, shown for and within the computer 100 may be implemented in the cluster management entity 72 shown in FIG. 2.

Computer 100 includes a processor unit 104 that is coupled to a system bus 106. Processor unit 104 may utilize one or more processors, each of which has one or more processor cores. A video adapter 108, which drives/supports a display 110, is also coupled to system bus 106. In one embodiment, a switch 107 couples the video adapter 108 to the system bus 106. Alternatively, the switch 107 may couple the video adapter 108 to the display 110. In either embodiment, the switch 107 is a switch, preferably mechanical, that allows the display 110 to be coupled to the system bus 106, and thus to be functional only upon execution of instructions that support the processes described herein.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a printer 124, and (if a VHDL chip 137 is not utilized in a manner described below), external USB port(s) 126. While the format of the ports connected to I/O interface 116 may be any known to those skilled in the art of computer architecture, in a preferred embodiment some or all of these ports are universal serial bus (USB) ports.

As depicted, the computer 100 is able to communicate over a network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 100. This volatile memory includes additional higher levels of volatile memory (not shown), including, but not limited to, cache memory, registers and buffers. Data that populates system memory 136 includes the computer's operating system (OS) 138 and application programs 144.

The operating system 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management. Application programs 144 in the system memory of computer 100 may include a power distribution system configuration detection and load balancing program 148. The system memory 136 may also store a configuration and load table 150 for use in the methods described herein.

The system memory 136 may also include a VHDL (VHSIC hardware description language) program. VHDL is an exemplary design-entry language for field programmable gate arrays (FPGAs), application specific integrated circuits (ASICs), and other similar electronic devices. In one embodiment, execution of instructions from a VMPP causes a VHDL program to configure the VHDL chip 137, which may be an FPGA, ASIC, or the like.

In another embodiment of the present invention, execution of instructions from VMPP results in a utilization of VHDL program to program a VHDL emulation chip 151. VHDL emulation chip 151 may incorporate a similar architecture as described above for VHDL chip 137. Once VMPP and VHDL program the VHDL emulation chip 151, VHDL emulation chip 151 performs, as hardware, some or all functions described by one or more executions of some or all of the instructions found in VMPP. That is, the VHDL emulation chip 151 is a hardware emulation of some or all of the software instructions found in VMPP. In one embodiment, VHDL emulation chip 151 is a programmable read only memory (PROM) that, once burned in accordance with instructions from VMPP and VHDL program, is permanently transformed into a new circuitry that performs the functions needed to perform the processes of the present invention.

The hardware elements depicted in computer 100 are not intended to be exhaustive, but rather are representative devices suitable to perform the processes of the present invention. For instance, computer 100 may include alternate memory storage devices such as magnetic cassettes, digital versatile disks (DVDs), Bernoulli cartridges, and the like. These and other variations are intended to be within the spirit and scope of the present invention.

FIG. 10 is one embodiment of a configuration and load table 150 illustrating one example of the information that may be collected by the cluster management entity about configuration of the power distribution system and the load on the entities of the power distribution system. As a first matter, the table includes the configuration data that the cluster management entity has collected from the management processors in the power distribution system. The organization of the table illustrates the electrical connections as identified by a first identification code (first endpoint) and a second identification code (second endpoint). Specifically, entities sharing a row of the table are connected. For example, a 440 VAC power source supplies electrical power to three lines (L1, L2, L3). There have been three electrical connections identified to the cluster management that include the electrical power supply line identification code for line L1, and those three electrical connections also identify the circuit breaker panel identification codes for circuit breaker panels BP1, BP2 and BP3. Accordingly, these three circuit breaker panels are placed in the table in the same row as the line L1. Similarly, there have been four additional electrical connections identified to the cluster management that include the circuit breaker panel identification code for circuit breaker BP1, and those four electrical connections also identify the power distribution unit identification codes for power distribution units PDU#1, PDU#2, PDU#3 and PDU#4. Although the BP and PDU numbers are repeated for other electrical connections, these are other BPs and PDUs with their own identification codes.

Server loads and associations to particular PDUs are also provided to the cluster management entity and this is also provided in the table. Although shown as a break out portion 152, Servers 1-1 through 1-5 are connected to the PDU#1, and the individual server loads are known. The PDU load is the cumulative total of the individual server loads. Furthermore, the cluster management entity may calculate the load on any PDU, any circuit breaker panel, and any power line. As shown, the cumulative load on each of the three power lines L1, L2 and L3 are shown. Any imbalance between the three phases can now be easily detected and quantified. Furthermore, the cluster management entity may initiate one or more actions, as described above, to alter the balance of the load on the three phases. As shown in table 150, it might be desirable to move some of the load from a server that receives power from line L1 to a server that received power from line L3.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
   a plurality of servers in communication with a cluster management entity;
   a power distribution system including a three phase electrical source, each phase having at least one electrical power supply cable forming an electrical connection from the phase to at least one circuit breaker panel for providing electrical power to the at least one circuit breaker panel, each circuit breaker panel having at least one electrical power supply cable forming an electrical connection from the circuit breaker panel to at least one power distribution unit for providing electrical power to the at least one power distribution unit, and each of the power distribution units having at least one electrical power supply cable forming an electrical connection from the power distribution unit to at least one of the servers for providing electrical power to the at least one of the servers;
   each circuit breaker panel having a circuit breaker panel management processor; and
   each power distribution unit having a power distribution unit management processor;
   wherein, for each power distribution unit, the power distribution unit management processor of the power distribution unit is in digital communication with the circuit breaker panel management processor of the circuit breaker that provides electrical power to the power distribution unit, wherein the digital communication is carried over the electrical power supply cable forming the electrical connection between the power distribution unit and the circuit breaker panel, and wherein the circuit breaker panel management processor and the power distribution unit management processor are coupled for communication with the cluster management entity.

2. The system of claim 1, wherein the circuit breaker panel management processor stores a circuit breaker panel identification code and the power distribution unit management processor stores a power distribution unit identification code.

3. The system of claim 1, further comprising:
   an electrical phase management processor coupled to each of the three phases; and
   a carrier detection circuit allowing a valid communication with the electrical phase management processor to occur on only one of the three phases at a time, wherein the carrier detection circuit identifies the phase from which the valid communication occurs.

4. The system of claim 3, wherein, for each circuit breaker panel, the circuit breaker panel management processor of the circuit breaker panel is in digital communication with the electrical phase management processor over the electrical cable forming the electrical connection between the circuit breaker panel and one of the phases.

5. The system of claim 4, wherein the electrical phase management processor is coupled for communication with the cluster management entity.

* * * * *